(12) United States Patent
Barth et al.

(10) Patent No.: US 7,786,584 B2
(45) Date of Patent: Aug. 31, 2010

(54) THROUGH SUBSTRATE VIA SEMICONDUCTOR COMPONENTS

(75) Inventors: Hans-Joachim Barth, Munich (DE); Jens Pohl, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 401 days.

(21) Appl. No.: 11/944,846

(22) Filed: Nov. 26, 2007

(65) Prior Publication Data

US 2009/0134497 A1 May 28, 2009

(51) Int. Cl.
*H01L 23/48* (2006.01)
*H01L 21/44* (2006.01)

(52) U.S. Cl. ........................ 257/758; 438/597

(58) Field of Classification Search ............ None
See application file for complete search history.

(56) References Cited

U.S. PATENT DOCUMENTS

| | | | |
|---|---|---|---|
| 5,424,245 A | 6/1995 | Gurtler et al. | |
| 5,493,096 A | 2/1996 | Koh | |
| 5,501,893 A | 3/1996 | Laermer et al. | |
| 5,599,744 A | 2/1997 | Koh et al. | |
| 5,679,978 A | 10/1997 | Kawahara et al. | |
| 5,923,088 A * | 7/1999 | Shiue et al. | 257/758 |
| 6,222,270 B1 * | 4/2001 | Lee | 257/758 |
| 6,908,841 B2 | 6/2005 | Burrell et al. | |
| 7,148,574 B2 * | 12/2006 | Lee et al. | 257/773 |
| 7,217,979 B2 * | 5/2007 | Matsunaga et al. | 257/355 |
| 7,391,114 B2 * | 6/2008 | Mimura et al. | 257/758 |
| 7,397,125 B2 * | 7/2008 | Oda | 257/758 |
| 2005/0127529 A1 * | 6/2005 | Huang et al. | 257/779 |
| 2006/0273455 A1 | 12/2006 | Williams et al. | |
| 2007/0085198 A1 | 4/2007 | Shi et al. | |
| 2007/0152194 A1 | 7/2007 | Natekar et al. | |
| 2007/0166997 A1 * | 7/2007 | Knorr | 438/622 |
| 2007/0228546 A1 | 10/2007 | So et al. | |

* cited by examiner

*Primary Examiner*—Scott B Geyer
(74) *Attorney, Agent, or Firm*—Slater & Matsil, L.L.P.

(57) ABSTRACT

A structure and method of forming landing pads for through substrate vias in forming stacked semiconductor components are described. In various embodiments, the current invention describes landing pad structures that includes multiple levels of conductive plates connected by vias such that the electrical connection between a through substrate etch and landing pad is independent of the location of the bottom of the through substrate trench.

25 Claims, 15 Drawing Sheets

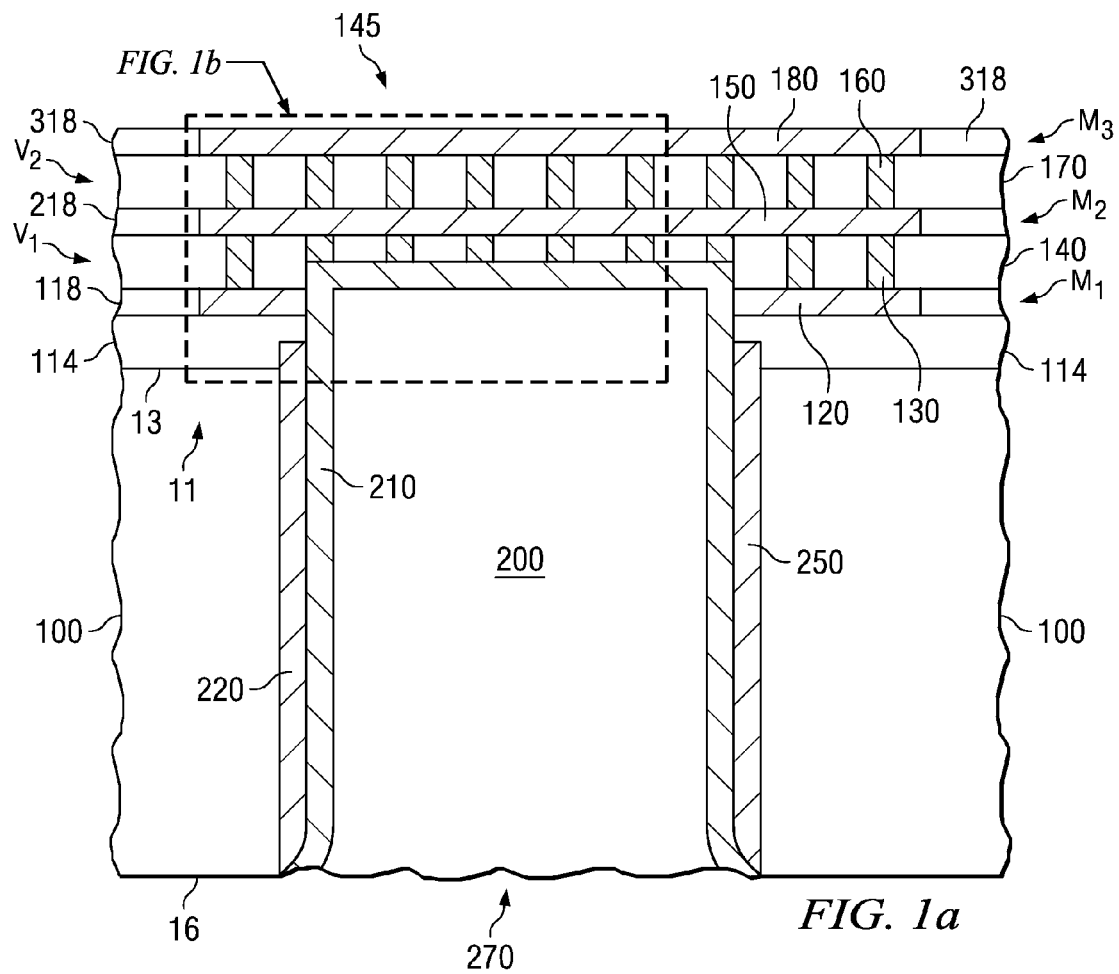
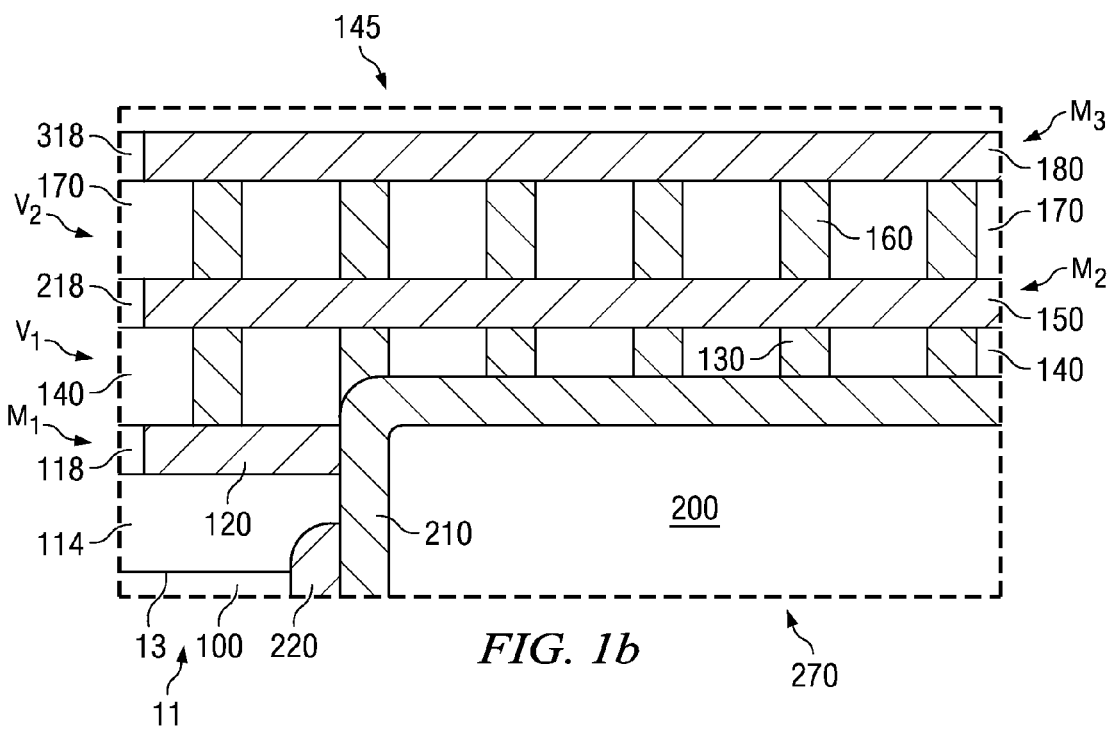

THROUGH SUBSTRATE VIA SEMICONDUCTOR COMPONENTS

TECHNICAL FIELD

This invention relates generally to electronic devices, and more particularly to through substrate via semiconductor components.

BACKGROUND

One of the goals in the fabrication of electronic components is to minimize the size of various components. For example, it is desirable that hand held devices such as cellular telephones and personal digital assistants (PDAs) be as small as possible. To achieve this goal, the semiconductor circuits that are included within the devices should be as small as possible. One way of making these circuits smaller is to stack the chips that carry the circuits.

A number of ways of interconnecting the chips within the stack are known. For example, bond pads formed at the surface of each chip can be wire-bonded, either to a common substrate or to other chips in the stack. Another example is a so-called micro-bump 3D package, where each chip includes a number of micro-bumps that are routed to a circuit board, e.g., along an outer edge of the chip.

Yet another way of interconnecting chips within the stack is to use through-vias. Through-vias extend through the substrate thereby electrically interconnecting circuits on various chips. Through-via interconnections can provide advantages in terms of interconnect density compared to other technologies. However, introduction of such interconnects may introduce additional challenges.

The integration of chips in 3D brings-forth a number of new challenges that need to be addressed. Hence, what is needed in the art are improved structures and methods of producing structures for 3D chip integration.

SUMMARY OF THE INVENTION

These and other problems are generally solved or circumvented, and technical advantages are generally achieved, by embodiments of the present invention which provide through silicon vias TSV and methods of manufacture thereof.

Embodiments of the invention include methods and structures for forming landing pads for through substrate vias. In accordance with an embodiment of the present invention, the structure includes a substrate with an upper surface and an opposite lower surface, the upper surface containing active devices, landing pads comprising multiple levels of conductive plates connected by vias disposed above the upper surface, and a through-via with a bottom surface disposed in the substrate that extends from the upper surface through the lower surface into the landing pads, wherein the through via establishes an electrical connection with the landing pads independent of a location of the bottom surface in the landing pads.

The foregoing has broadly outlined the features of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates an embodiment of a chip with a through substrate via contacting a landing pad, wherein the landing pad comprises metal levels connected by a sea of vias, and wherein FIG. 1a illustrates the landing pad on the wafer, and FIG. 1b illustrates a magnified partial view of the landing pad illustrated in FIG. 1a;

FIG. 2, which includes

FIG. 3, which includes FIGS. 3a-3c, illustrates a landing pad used for stopping a through substrate via etch process in an embodiment of the invention, wherein FIG. 3a illustrates the top view, and FIGS. 3b and 3c illustrate vertical cross sections along the landing pad;

FIG. 6, which includes

FIG. 8, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 2A:
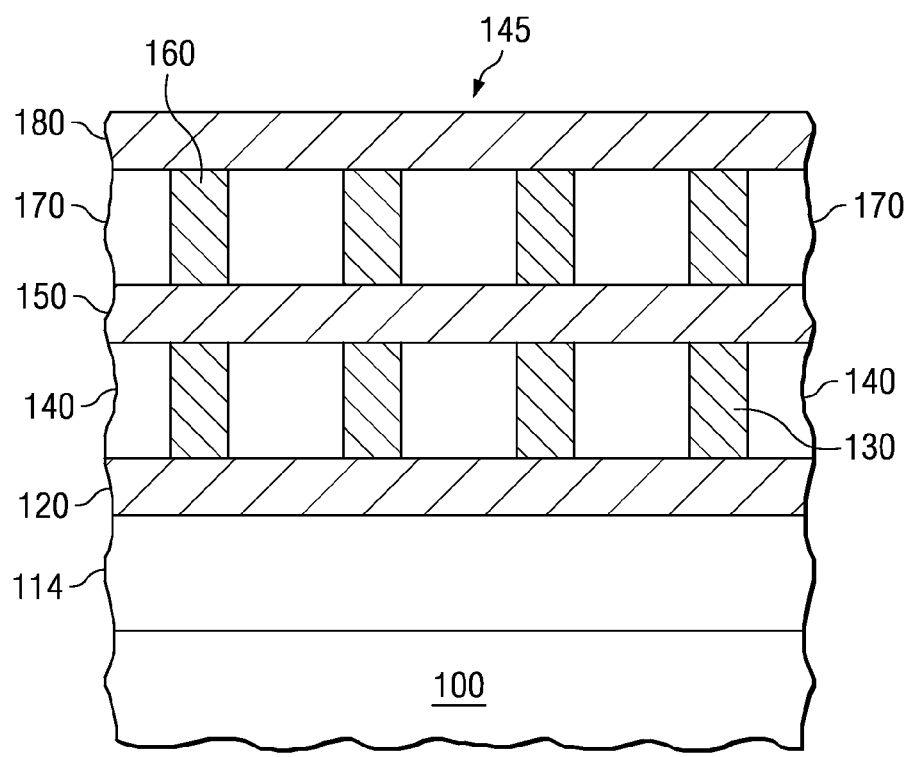
FIGS. 2a-2c, illustrates a landing pad used for stopping the through substrate via etch, in various embodiments of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely landing pads for connecting through substrate vias. The invention may also be applied, however, to other semiconductor components comprising, for example, multiple chips and/or landing pads, and/or through substrate vias. One of ordinary skill in the art will be able to recognize further examples as well.

Embodiments of the present invention utilize through substrate vias to create 3D chip packages. Stacking chips on top of one another provides a means to achieve density, increased functionality, and/or additional performance. One way to realize the full benefits of chip stacking is to connect the chips using deep, or through substrate vias. These vias extend from the active circuitry at one face of the chip to a bottom surface of the chip. However, forming through substrate vias is challenging due to their high aspect ratios, as well as due to the necessity to stop the through substrate via etch process at an appropriate level required for making the electrical connections.

One of the key problems associated with stacking such devices arises from yield loss from stopping the through substrate via etch either too early or too late. If the through substrate via etch is stopped too early, the through substrate via fails to contact landing pads that electrically link to active circuitry on the front of the wafer. On the other hand, if the etch is stopped too late, the landing pad structure is mechanically unstable and collapses. In various embodiments, the present invention overcomes these limitations by using vias.

In various embodiments, the present invention overcomes these limitations by forming a landing pad structure that comprises multiple levels of conductive plates connected by multiple layers of vias. Hence, the landing pad electrically contacts the through substrate via irrespective of the actual location of the bottom of the through substrate via.

Structural embodiments of the invention will be first described using FIGS. 1-4. Various embodiments of the method of fabrication will then be described using the flow charts of FIGS. 5 and 7, and FIGS. 6 and 8.

An embodiment of the invention is illustrated in FIG. 1 which includes FIG. 1a and 1b. FIG. 1a illustrates the through substrate via (TSV) chip and FIG. 1b illustrates a magnified cross section of the TSV chip.

Referring to FIG. 1a, the substrate 100 comprises a top surface 13 and a lower surface 16. The active regions 11 are disposed on the top surface 13 and comprise active devices such as transistors, resistors, capacitors, diodes, etc. (not shown). Metallization levels are disposed over the top surface 13 of the substrate 100.

A TSV 270 formed by filling a through trench 250 with a fill material 200 is disposed inside the substrate 100. A through trench 250 penetrates through the substrate to a landing pad 145. The landing pad 145 is sufficiently wider compared to the width of the through trench 250 to ensure adequate contact. However, with improved aligning techniques, this may not be necessary.

The through trench 250 is lined with a sidewall dielectric layer 220 to electrically insulate the active regions from the TSV 270. Further, a trench metal liner 210 is disposed on the sidewalls of the through trench 250 over the sidewall dielectric layer 220 and over the bottom of the contacted area on the landing pad 145. The trench metal liner 210 acts as a metal diffusion barrier. In some embodiments, the trench metal liner 210 contains a seed layer used during subsequent electroplating processes. The landing pad 145 electrically connects to the TSV 270, and is also electrically connected with other parts of the active circuitry, thus electrically connecting the active devices with the TSV 270.

As illustrated in FIG. 1a and FIG. 1b (a magnified illustration of FIG. 1a), a first insulating material layer 114 is disposed above the substrate 100. A first conductive plate 120 from the first level of metallization ($M_1$) is disposed above the insulating material layer 114, and is embedded in a second insulating material layer 118. A second conductive plate 150 is embedded in a fourth insulating material layer 218 and disposed above a third insulating material layer 140. The third insulating material layer 140 is typically a ultra low k dielectric. First vias 130 from the first via level $V_1$ connect the first conductive plate 120 to the second conductive plate 150 and are disposed inside the third insulating material layer 140. Similarly, a third conductive plate 180 is disposed above a fifth insulating material layer 170, and second vias 160 connect the third conductive plate 180 to the second conductive plate 150. Further metal lines and via levels may be added as necessary on top of the third conductive plate 180. Although the TSV 270 extends up to the first vias 130 as illustrated in FIG. 1b, in other embodiments the TSV 270 may extend to lower or higher layers of the landing pad 145.

Figure 2B:
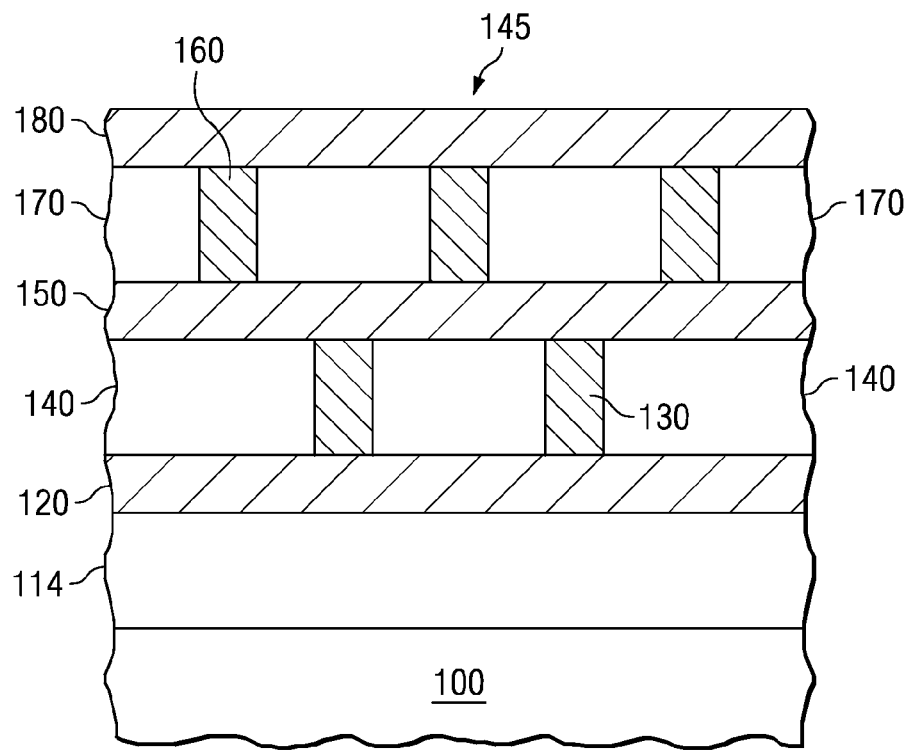
Figure 2C:
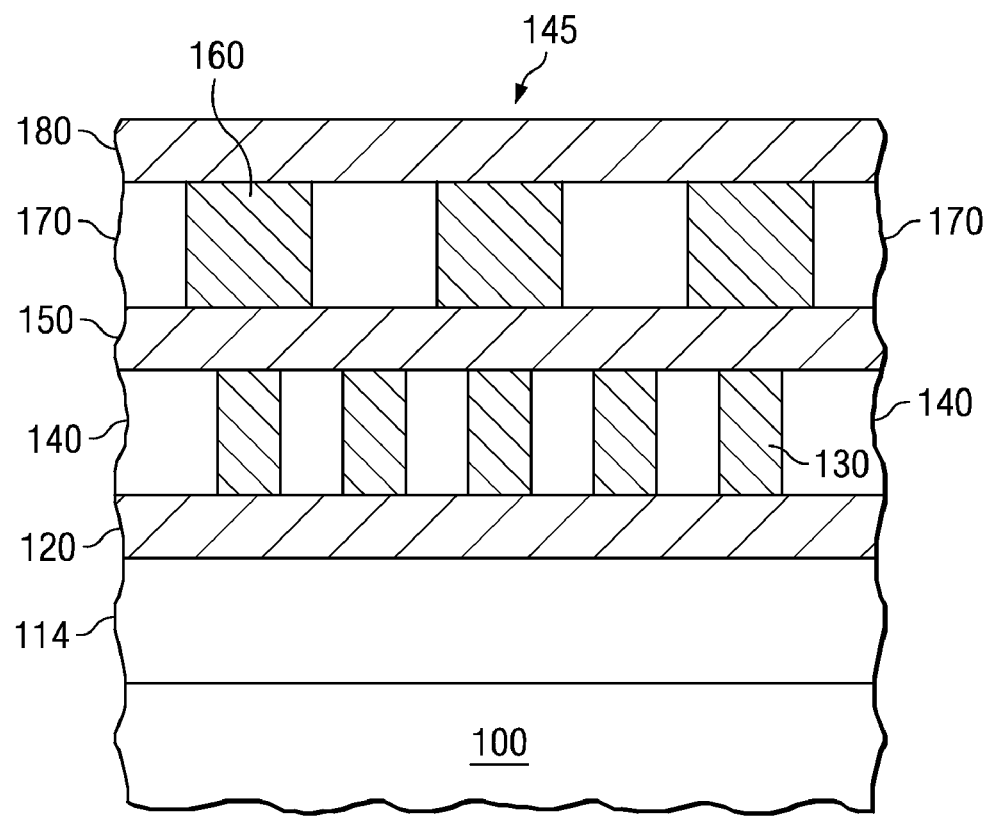

Embodiments of the landing pad 145 are now illustrated using FIGS. 2 and 3. FIGS. 2a-2c illustrate cross sections of a landing pad 145, wherein the different embodiments illustrate different designs of the landing pad 145. In FIG. 2a, first vias 130 and second vias 160 are aligned, whereas in FIG. 2b first vias 130 and second vias 160 are staggered. In other embodiments, first and second vias 130 and 160 may be formed in other alignments. In FIG. 2c, the dimensions of second vias 160 are larger than the dimensions of first vias 130. The first, second and third conductive plates 120, 150 and 180 may comprise either a similar shape or different shapes. For example, in different embodiments, the shapes of first, second and third conductive plates 120, 150 and 180 may be rectangular or circular. Similarly, the first vias and second vias may comprise any suitable shapes.

Figure 3A:
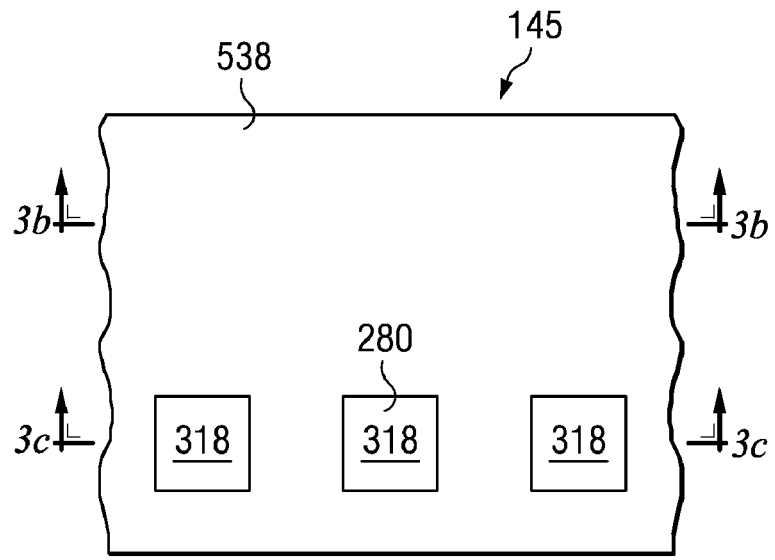
Figure 3B:
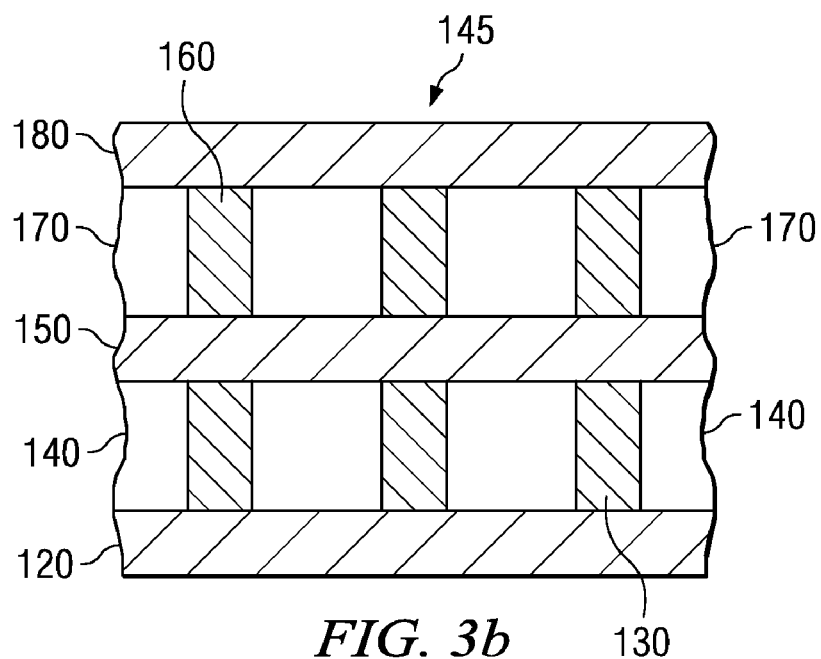
Figure 3C:
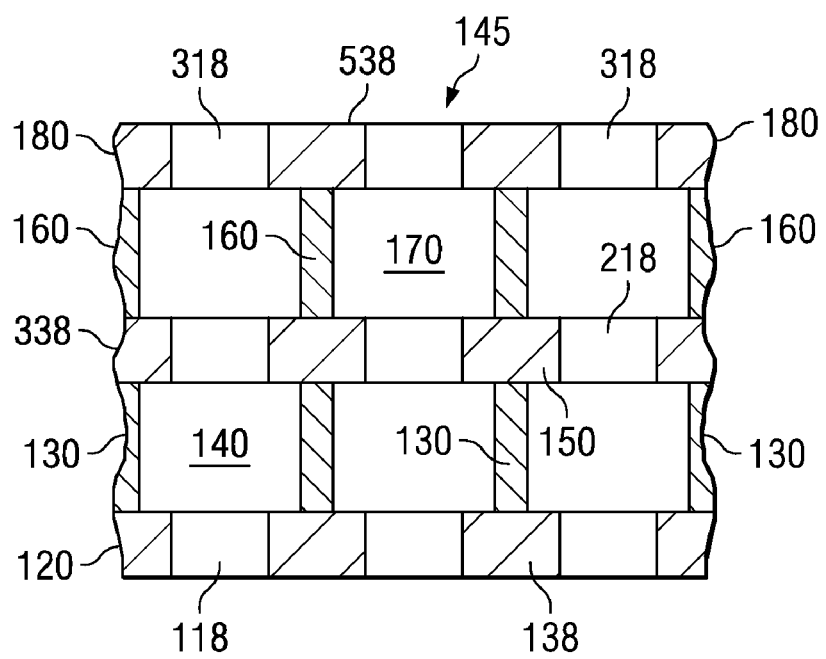

FIG. 3, which includes FIGS. 3a-3c, illustrates an embodiment of the invention for a landing pad 145 to minimize process variations during subsequent polishing processes. FIG. 3a illustrates a top view of a landing pad 145 to overcome these limitations, while FIGS. 3b-3c illustrate cross sections of the landing pad 145 at different points.

The fill material 200 used in the through substrate via (e.g., described in FIG. 1) typically comprises a conductive material, preferably copper or alternatively, aluminum, tungsten, silver, gold or doped polysilicon. The material of the conductive plates 120, 150 and 180 is a conductive material, preferably copper or other metals like aluminum, tungsten, silver, gold or any metal alloy. However, copper is softer than silicon dioxide, and hence more sensitive to the chemical slurry of the chemical mechanical polishing (CMP). Hence, the polishing rate of copper is faster during CMP, resulting in thinner metal thickness than expected. Further, the surface of large metal areas (>20 $\mu m^2$) exhibits a cylindrical shape after polishing (more polishing of copper near the center of the landing pad 145, the so called dishing effect). The loss of copper is pattern dependent and is more significant in wide areas, e.g., dense structures, compared to isolated structures (narrow regions of copper). Both erosion of dense structures and dishing of large metal area structures degrade the process quality, and cause significant yield losses, for example, due to high resistance of the metal or due to lack of electrical connection. Embedding dummy patterns of harder materials into the softer copper regions is one way of overcoming or reducing dishing effects. In various embodiments, such dummy patterns of dielectric islands (e.g., oxide, nitride, dense or porous low k materials) in large metal (e.g., Cu, Al or W) areas are used to reduce the dishing effect in wide metal pads or wide metal lines. In some embodiments, other dummy metal patterns embedded in the dielectric surrounding isolated metal regions (regions with less copper) may be introduced to achieve uniform polishing rates across the wafer.

As the polish rate of a CMP process is typically optimized for forming the interconnect structure over active circuitry (e.g., dense structures), use of such a polishing process will significantly over etch copper on the landing pad 145 (e.g. in FIG. 2a).

As illustrated in an embodiment of the present invention in FIG. 3a, dielectric islands 280 reduce the polishing rate of copper or other metals on the landing pad 145. In such embodiments, dielectric islands 280 are formed inside the landing pad 145. The dielectric islands 280 may be embedded across the entire depth of the metallization as illustrated in FIG. 3c. For example, in FIG. 3c, the dielectric islands 280 are formed from the first conductive plate 120 to the third conductive plate 180. However, in other embodiments the dielectric islands 280 may be different between the first, second and third conductive plates 120, 150 and 180. The dielectric islands 280 are formed during the formation of the landing pad 145 along with first, second and third conductive plates 120, 130 and 150. The dielectric islands 280 are formed from a vertical stack of layers: a first insulating material layer 114, a second insulating material layer 118, a third insulating material layer 140, a fourth insulating material layer 218, a fifth insulating material layer 170, and a sixth insulating material layer 318. As illustrated in FIG. 3c, the landing pad 145 contains first, second and third conductive plates 120, 150 and 180 embedded in the second, fourth and sixth insulating material layers 118, 218 and 318, respectively. Although the number of vias per cross sectional area decreases due to the presence of oxide islands 280, sufficient via density is attainable. Hence, even if the through substrate etch stops either inside the third or fifth insulating material layers 140 or 170, electrical connectivity may be maintained without significant increase in resistance or loss of electrical connectivity (yield loss).

Figure 4:
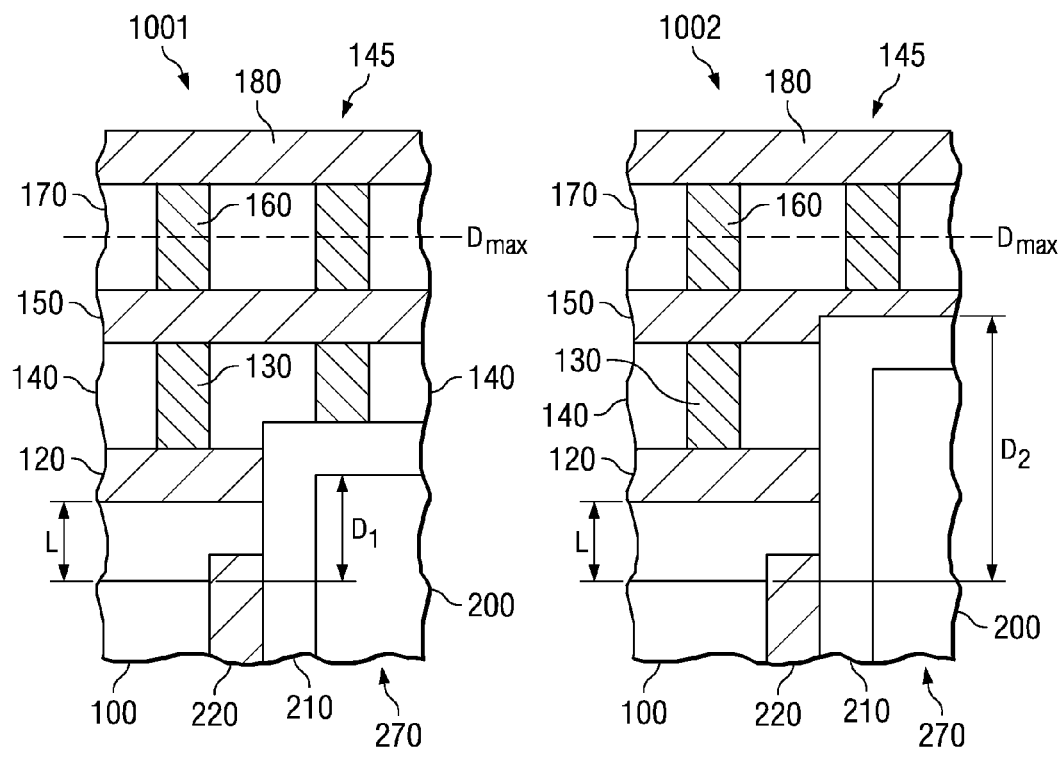
FIG. 4 illustrates a landing pad used for stopping the through substrate via etch in different regions across the chip or wafer, in accordance with an embodiment of the present invention.

An embodiment of the invention is now discussed illustrating a TSV 270 in first and second regions 1001 and 1002 of a substrate 100, as shown in FIG. 4. The first and second regions 1001 and 1002 are different regions along the wafer across different chips. However, in some embodiments, the first and second regions 1001 and 1002 may be different regions within a single chip. In FIG. 4, the landing pad 145 includes first, second and third conductive plates 120, 150 and 180, and first and second vias 130 and 160. Although three metal levels are shown, in various embodiments, more or less number of metal levels may be used. The TSV 270 comprises sidewall dielectric layer 220 and trench metal liner 210 and filled with fill material 200. However, in other embodiments any suitable liner may be used. The landing pad 145 is disposed a distance L above the surface of the substrate 100. The TSV 270 extends to the landing pad 145 as illustrated. However, in the first region 1001, the TSV 270 extends into the landing pad 145 to a distance $D_1$, whereas in the second region 1002 the TSV 270 extends deeper into the landing pad 145 to a distance $D_2$. Further, a maximum allowed distance $D_{max}$ may be determined to minimize mechanical instability of the landing pad 145. In various embodiments, the region 1002 is around the center of the wafer and the region 1001 is near the periphery of the semiconductor wafer. Depending on the etch rate uniformity of the particular TSV etch process the region 1001 can also be placed at the center and the region 1002 may be placed near the periphery or in a doughnut shaped area in the middle of the semiconductor wafer. The distance $D_2$ in the second region 1002 relative to a maximum allowed distance $D_{max}$ is about 0.5 to about 0.9. Similarly, the distance $D_1$ in the first region 1001 relative to a maximum allowed distance $D_{max}$ is about 0.1 to about 0.5. Further, to minimize variation, the ratio of $D_2$ to $D_1$ varies from about 1:0.6 to about 0.6:1. In some areas of the wafer, the distance $D_1$ may be fully landing and stopping in the first conductive plate 120.

Embodiments of the method of fabrication will be described using FIGS. 6 and 8 and flow charts of FIGS. 5 and 7. The fabrication of landing pads in various embodiments will be described with respect to FIG. 6 and the flow chart of FIG. 5, in accordance to an embodiment of the invention.

Figure 5:
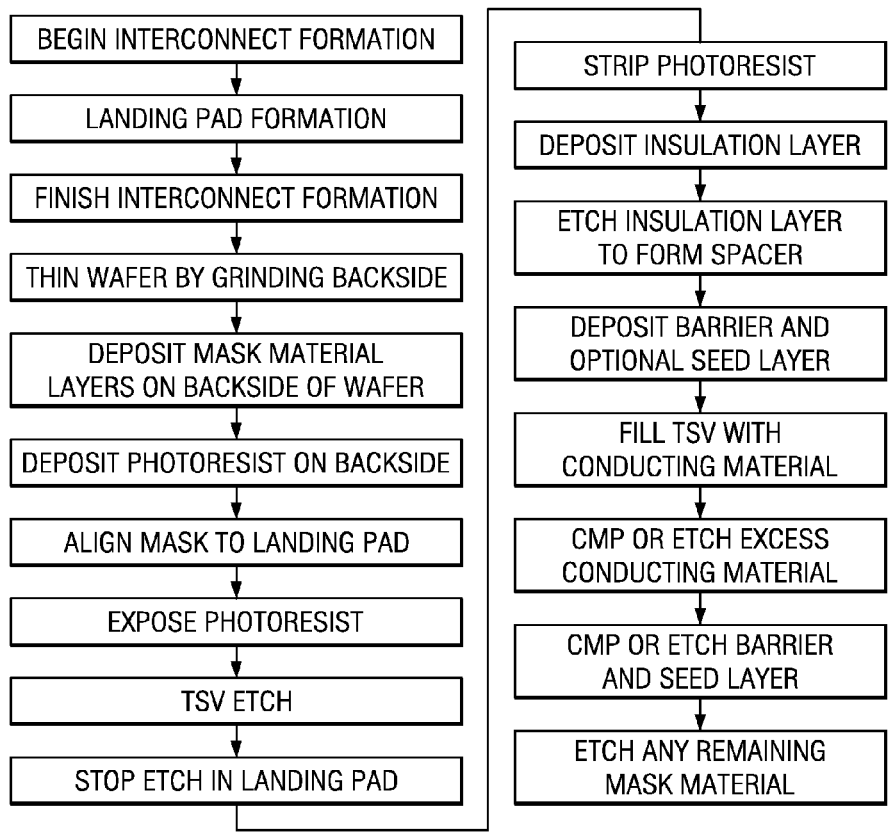
FIG. 5 is a flow chart of a method of forming the through substrate via chip according to an embodiment of the invention.
Figure 6A:
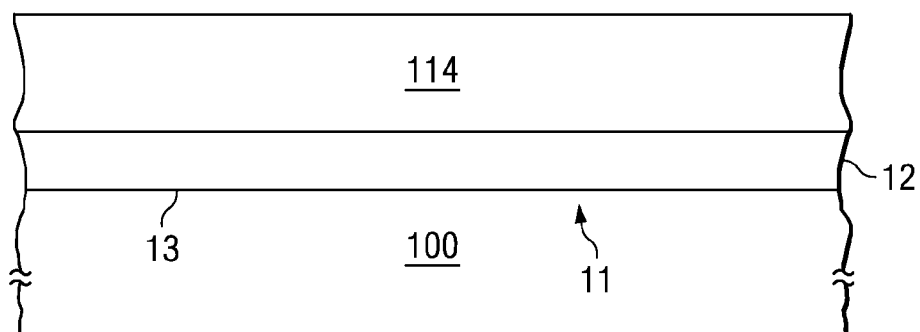
FIGS. 6a-6l, illustrates a method of manufacturing a through substrate via chip; according to the embodiment illustrated in FIG. 5.

Referring to FIG. 6a and as illustrated in flow chart of FIG. 5, active device regions 11 are formed on a side near a top surface 13 of a substrate 100 during front end processing. The substrate 100 is typically a semiconductor wafer. The active device regions 11 or active circuitry can include transistors, resistors, capacitors, inductors or other components used to form integrated circuits. For example, active areas that include transistors (e.g., CMOS transistors) can be separated from one another by isolation regions, e.g., shallow trench isolation.

Next, metallization is formed over the active device regions 11 to electrically contact and interconnect the active device regions 11. The metallization and active circuitry together form a complete functional integrated circuit. In other words, the electrical functions of the chip can be performed by the interconnected active circuitry. In logic devices, the metallization may include many layers (e.g., nine or more, of copper). In memory devices, such as DRAMs, the number of metal levels may be less and may be aluminum.

Returning to the flow chart of FIG. 5, the components formed during the front-end process are interconnected by back end of line (BEOL) processing. During this process, contacts are made to the semiconductor body and interconnected using metal lines and vias. As discussed above, modern integrated circuits incorporate many layers of vertically stacked metal lines and vias (multilevel metallization) that interconnect the various components in the chip. FIGS. 4a-4e illustrate the formation of landing pad 145 using this multilevel metallization during the BEOL processes, in accordance to an embodiment of the invention.

Referring now to FIG. 6a, the substrate 100 comprises a top surface 13 and a bottom surface 14. A first insulating material layer 114 is then formed over an etch stop liner 12. The etch stop liner 12 is deposited over the semiconductor body. For example, a nitride film (e.g., silicon nitride) is deposited. The insulating material layer 114 preferably comprises insulating materials typically used in semiconductor manufacturing for inter-level dielectric (ILD) layers, such as $SiO_2$, tetra ethyl oxysilane (TEOS), fluorinated TEOS (FTEOS), doped glass (BPSG, PSG, BSG), organo silicate glass (OSG), fluorinated silicate glass (FSG), spin-on glass (SOG), SiN, SiON, or low k insulating materials, e.g., having a dielectric constant of about 4 or less, or combinations or multiple layers thereof, as examples, although alternatively, the insulating material layer 114 may comprise other materials. The ILD may also comprise dense SiCOH or a porous dielectric having a k value of about 3 or lower, as examples. The ILD may also comprise an ultra-low k (ULK) material having a k value of about 2.5 or lower, for example. The ILD may comprise a thickness of about 500 nm or less, for example, although alternatively, the ILD may comprise other dimensions.

Although, not used in this embodiment, in some embodiments the landing pad 145 may include substrate contact vias. In regions with substrate contact vias, the first insulating material layer 114 and the etch stop liner 12 are patterned and etched. The substrate contact vias are made of a composite structure comprising a first conductive liner (e.g., PVD Ti/TiN or CVD titanium nitride and silicon doped tungsten) and a first conductive material (e.g., tungsten).

Figure 6B:
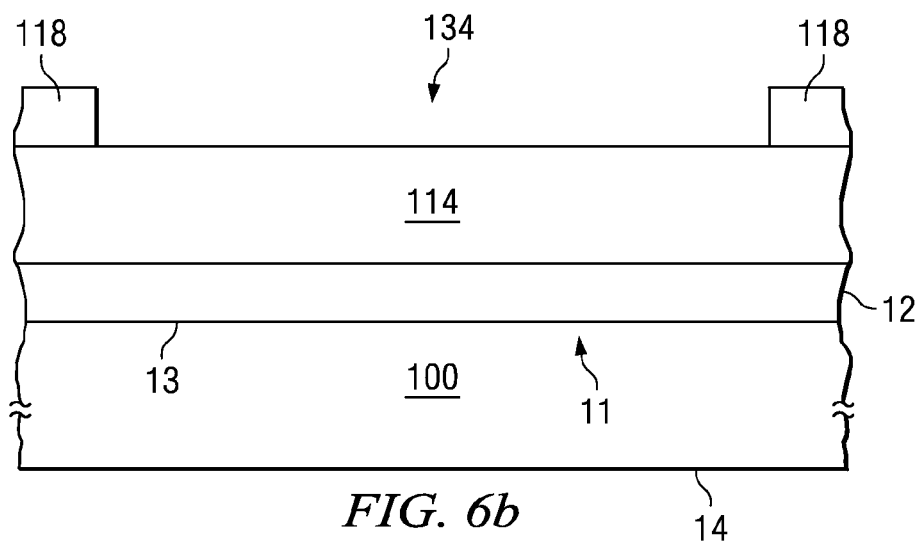

Referring now to FIG. 6b, a second insulating material layer 118 is then deposited over the first insulating material layer 114. The second insulating material layer 118 preferably comprises an oxide, FSG, FTEOS or any dense or porous low-k dielectric material. The second insulating material layer 118 is patterned via lithography, e.g., with a mask. A photoresist is deposited over the second insulating material layer 118, and portions of the photoresist are exposed, developed and removed, leaving a pattern for a metal line. The exposed second insulating material layer 118 is removed to form opening 134 in the second insulating material layer 118.

Figure 6C:
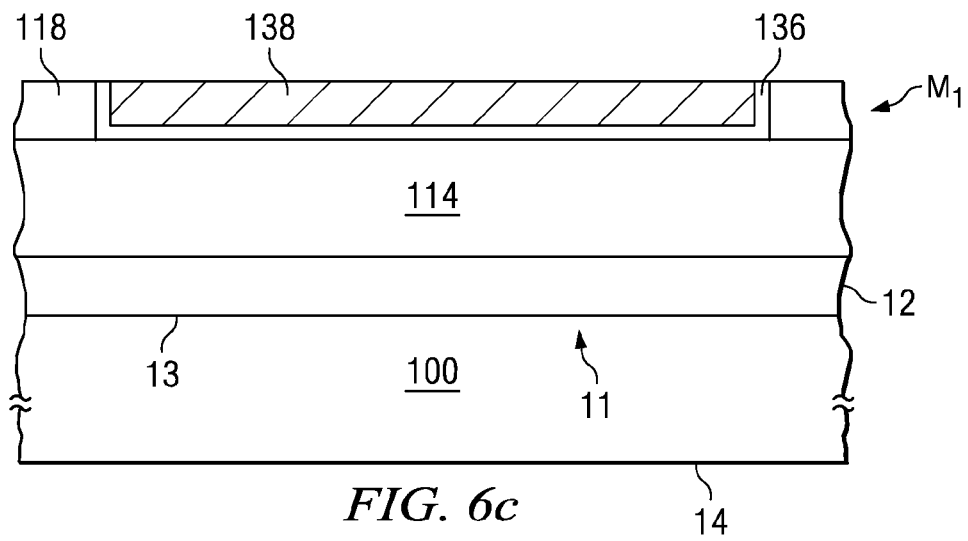

As illustrated in FIG. 6c, a second conductive liner 136 is preferably deposited using a PVD, CVD or ALD deposition process, leaving a conformal or at least continuous liner or diffusion barrier along the interior walls of opening 134. Preferably the second conductive liner 136 comprises tantalum and/or tantalum nitride deposited by plasma vapor deposition (PVD). Alternatively, the second conductive liner 136 may comprise titanium nitride, tungsten nitride, a refractory metal or other barrier layers that may be conformally or at least continuously deposited, for example, using CVD, PVD processes or electro-less plating. The second conductive liner 136 may comprise a bi-layer of material, including, for example, a barrier layer and a conformal or at least continuous seed layer, which preferably comprises copper, aluminum, other metals or combinations thereof. The seed layer may be deposited using a PVD or CVD process, for example.

The remainder of the opening 134 is filled with second conductive material 138, for example, using an electroplated fill process to create a first conductive plate 120 having a portion residing within the second insulating material layer 118 and a portion residing over the first insulating material layer 114. The second conductive material 138 preferably comprises copper, aluminum or other metals or combinations thereof.

Figure 6D:
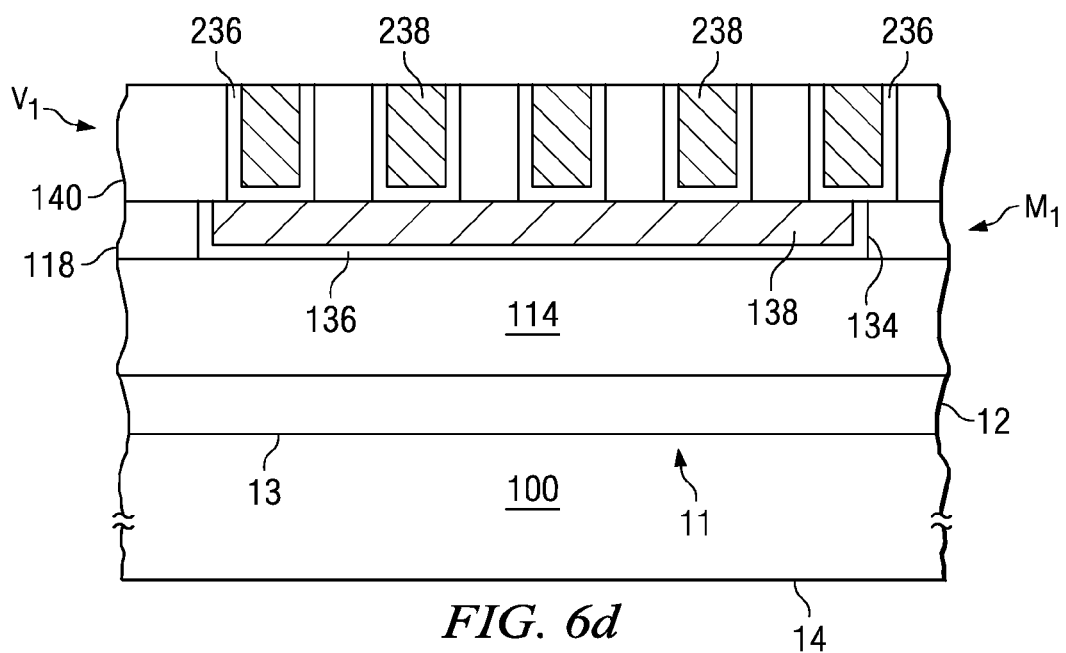
Figure 6E:
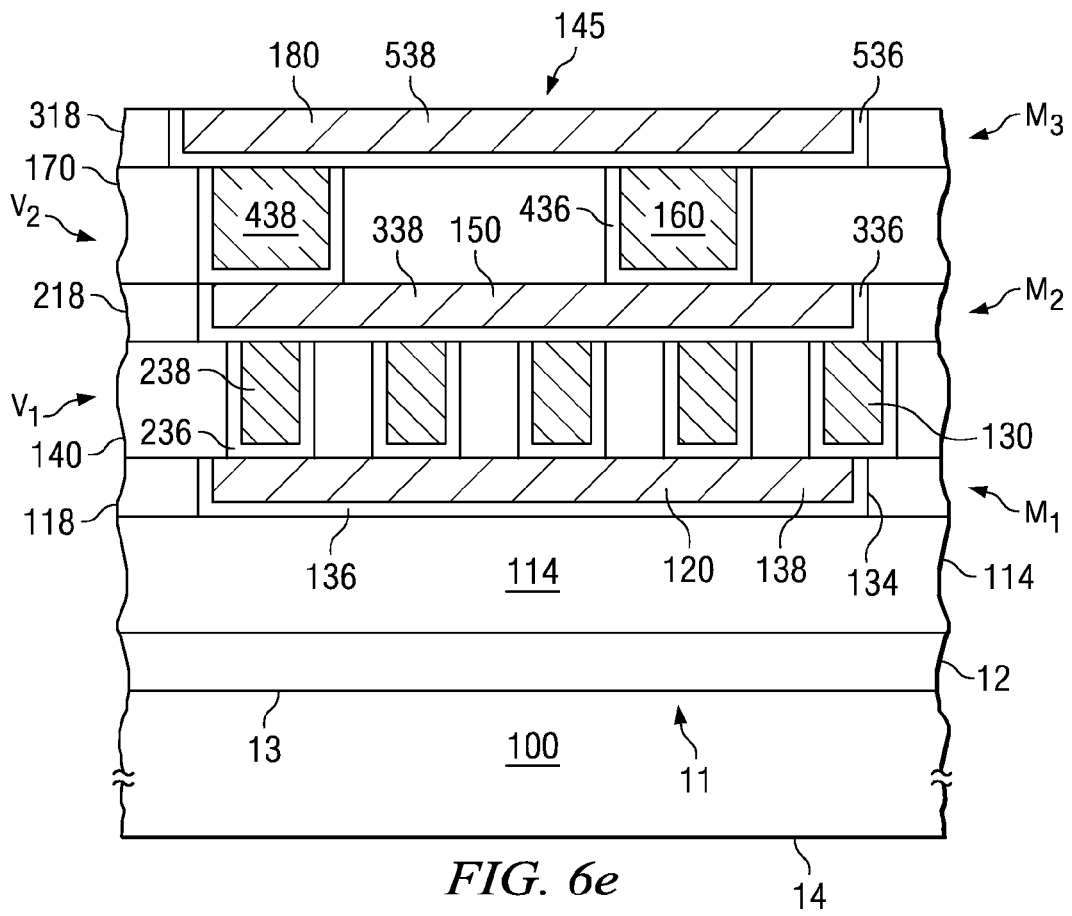

A third insulating material layer 140 is deposited over the second insulating material layer 118 and first conductive plate 120 to form a level of vias ($VL_1$), as shown in FIG. 6e. In various embodiments, the third insulating material 140 may also be a combination of different dielectric materials. In one embodiment, a rather thin dielectric diffusion barrier of approximately 20-50 nm thickness comprising silicon nitride, SiC or SiCN is deposited directly on top of the first conductive plate 120 followed by the deposition of the main part of the third insulating layer 140. The third insulating layer 140 may comprise silicon oxide, FSG, FTEOS, or any low k or ultra low k material or combinations thereof. The thin dielectric diffusion barrier prohibits out-diffusion of metal atoms or ions, especially Cu, out of the conductive plate 120 or out of any adjacent metal lines of the same metal interconnect level. This dielectric diffusion barrier is not shown in any of the figures, but may be used optionally on top of all conductive plates 120, 150 and 180 and the respective metal lines of the interconnect wiring. After the deposition the third insulating material layer 140 is patterned and etched to create via holes. The via holes are filled with a third conductive liner 236 followed by electroplating a third conducting material 238 such as copper to form first vias 130. The device at this stage is shown in FIG. 6d.

The first conductive plate 120 and first vias 130 may be filled using single, dual, or multiple damascene processes. As illustrated above, in a single damascene process, a single layer of insulating material is patterned with a pattern for conductive features, such as conductive lines, conductive vias, or contacts. In contrast, in a dual damascene process, the vias and metals lines are patterned for conductive features and filled in a single fill step with a conductive material. Hence, in a dual damascene process, the third insulating material 140 and the fourth insulating material 218 are deposited together or in a sequence, the third conducting liner 236 and third conducting material 238 deposition are skipped, and instead via holes and metal lines or trenches are patterned in a sequence, followed by a single liner deposition and a single metal deposition and planarization. An example of a typical sequence for the dual damascene metal fill is TaN/Ta liner PVD, Cu seed layer PVD and Cu electroplating followed by a Cu- and liner-CMP planarization step. Other materials or processes for the barrier and metal fill and planarization may be used alternatively. Additional temporary fill materials may also be used during this process. Although the illustrated embodiment uses a single damascene process, embodiments of the invention may also be formed using dual or multiple damascene processes. In multiple damascene processes, three or more insulating material layers are patterned with patterns for conductive features and are later filled in a single fill step with a conductive material. For example, damascene processes are typically used when the conductive line material comprises copper.

Further levels of metal lines $M_2$, $M_3$, $M_4$, etc., and via levels $V_2$, $V_3$, $V_4$, etc., could proceed as discussed above by repeating the process for formation of metal lines and vias. FIG. 6e illustrates the landing pad 145 after the formation of second and third conductive plates 150 and 180, and second vias 160. The second conductive plates 150 are embedded in fourth insulating material layer 218 and are lined with a fourth conductive liner 336 followed by filling of a fourth conducting material 338 such as copper. The second vias are disposed above the second conductive plates 150 and are embedded in a fifth insulating material layer 170. The sidewalls of the second vias 160 are lined with fifth conductive liner 436 and filled with fifth conducting material 438. The third metal level $M_3$ comprising a third conductive plate 538 is disposed above the second vias. The third conductive plate 538 is embedded in a sixth insulating material layer 318, and is lined with sixth conductive liner 536 and filled with sixth conductive material 538. In some embodiments, the width of the higher via levels (e.g., $V_2$) may be increased relative to lower levels (e.g., $V_1$) to reduce resistance.

A passivation layer 15 is formed over the metallization layer. The passivation layer 15 can include more than one layer of material, such as silicon oxide, silicon nitride or silicon oxynitride or polyimide, as just a few examples. The passivation layer 15 may also include a thin dielectric diffusion barrier, silicon nitride, SiC or SiCN, directly on top of the last conductive plate or last metal level. The passivation layer 15 includes openings to expose the contact areas or bond and probe pads.

Figure 6F:
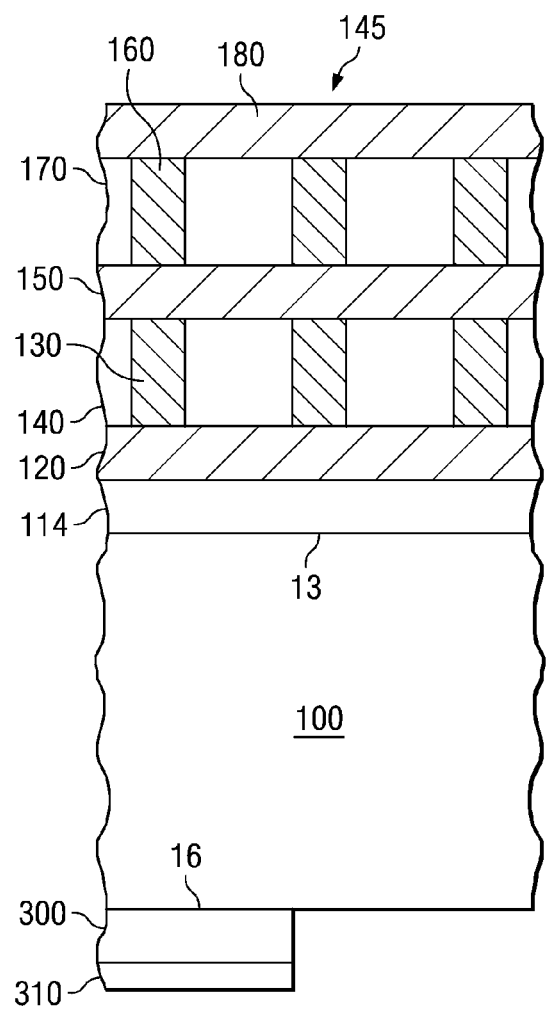

The formation of a TSV 270 is now illustrated using FIGS. 6f-6j. Although, only one TSV 270 is illustrated, a TSV chip may comprise more than one TSV 270. As illustrated in FIG. 6f, the substrate 100 is thinned exposing a lower surface 16 by grinding to a desired thickness. The typical thickness of the substrate 100 after the thinning is about 10 μm to about 150 μm. In different embodiments, the thinning may also be performed chemically or using a plasma. For example, a modified plasma etch may be used to thin the silicon wafer from the back side. Such techniques have the additional advantage of not damaging the front side.

The advantage of thinning the semiconductor wafer (or semiconductor chip, if the semiconductor wafer has already been diced) is to shorten the length of the through-vias, which enhances the electric properties and speeds up the via etch processing and creates a via with a relatively vertical sidewall.

The thinned substrate 100 may be attached to a suitable carrier for handling. A hard mask layer 300 is deposited on the lower surface 16 of the substrate 100. The hard mask layer 300 may be a single layer or comprise multiple layers. The hard mask layer 300 protects the lower surface 16 during the through trench etch. The hard mask layer 300 is selected based on the selectivity of the through trench etch process.

Through trench etch processes using a high density plasma with a fluorine chemistry typically utilize a SiO$_2$ hard mask layer 300. A photo resist layer 310 is spun over the hard mask layer 300.

The landing pads 145 are aligned to a mask using a mask aligner. The mask aligner comprises an infra red mask aligner to detect landing pads 145, although in other embodiments other suitable techniques may be used. The photo resist layer 310 is exposed and patterned. The hard mask layer 300 is etched to expose the lower surface 16 on the substrate 100 using the patterned photo resist layer 310 as a mask.

Figure 6G:
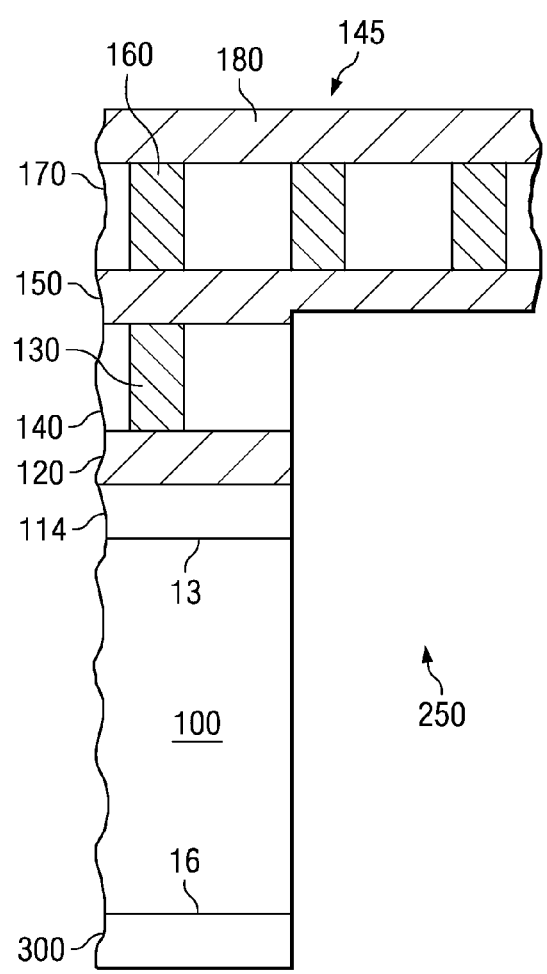

As illustrated in FIG. 6g, a high density plasma process in an RF plasma chamber is used to form a through trench 250. An etch step is carried out using a fluorine based plasma. However, fluorine based etches are isotropic and result in non vertical trench sidewalls. Hence, a deposition step is carried out by introducing a polymer producing gas into the plasma chamber. The polymer producing gas deposits a polymer layer on the exposed sidewalls forming a temporary etch stop layer. The polymer layer is not formed on the exposed bottom surface of the trench due to the high energy of the impinging ions. Any polymer deposited on the bottom surface of the trench is broken up by the high energy of the impinging ion. The through trench etch process is carried out in sequential etch and deposition steps. A vertical trench may thus be produced. For example, the fluorine etch step may comprise an SF$_6$ etchant, whereas the polymer producing gas may comprise C$_4$F$_8$. The etch and deposit steps may be repeated many number of times e.g., about 100 times to about 500 times, to form the through trench 250. In other embodiments, other types of reaction ion etch processes may be used. The through trench 250 after the etch step may comprise any suitable vertical shape such as cylindrical, annular, faceted, etc.

The etch step proceeds by etching the substrate 100 and opening the insulating material layer 114 for etching. Ideally, the through trench etch process should stop on the first conductive plate 120 or second conductive plate 150 to maximize electrical contact. Further, the landing pads 145 should have at least several microns of remaining interconnect material to support the structure mechanically.

The penetration of the etch process into the insulating material layer 114 as well into other dielectric layers is much smaller than silicon. Hence, thickness of these layers must be less than about 1 µm. The end point of the etch process is typically determined from an analysis (e.g., optically) during etching. For reliable detection, the thickness of the metal lines etched should be higher than about 700 nm. Hence, an etch process may etch beyond the first conductive plate 120, but stop in the first dielectric layer 140. In the absence of the vias 130 as illustrated in embodiments of the invention, such a through trench 250 is not electrically connected to front end interconnects and active devices. The presence of first and second vias 130 and 160 enables electrical connectivity independent of the etch stop point.

Figure 6H:
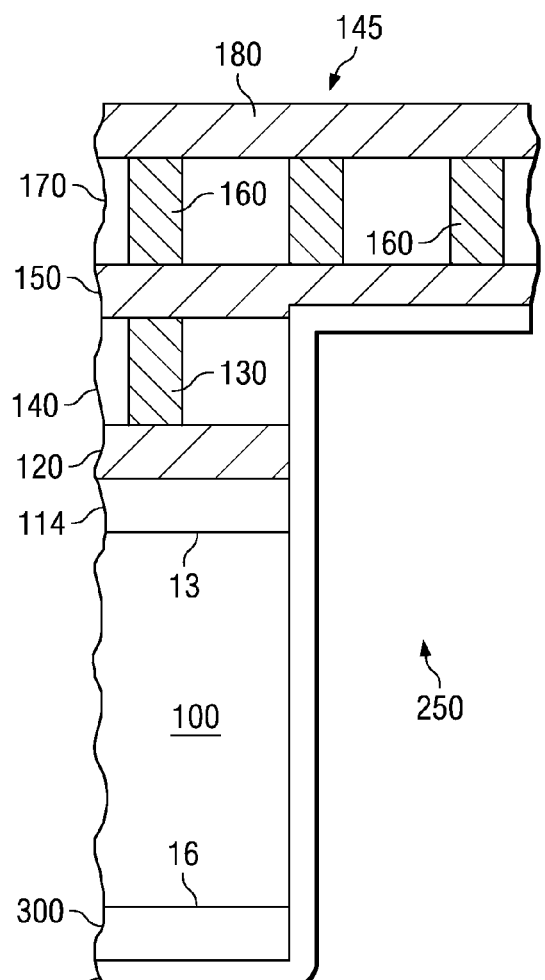

Referring to FIG. 6h, a sidewall dielectric layer 220 is next deposited over the trench. The sidewall dielectric layer 220 electrically isolates the trench fill material from active devices. The sidewall dielectric layer 220 is deposited conformally over the exposed surfaces of the through trench 250. The sidewall dielectric layer 220 may be deposited by a suitable low temperature process such as plasma enhanced CVD and/or organic vapor phase deposition, a spin-on or spray coating process. The sidewall dielectric layer 220 may consist of silicon oxide, silicon nitride, silicon oxynitride, SiC, SiCN, a dense or porous low k or ultra low k dielectric material, an organic material or polymere like parylene, BCB, SiLK or others. The sidewall dielectric layer 220 is anisotropically etched forming a sidewall spacer on the trench (FIG. 6i).

Figure 6I:
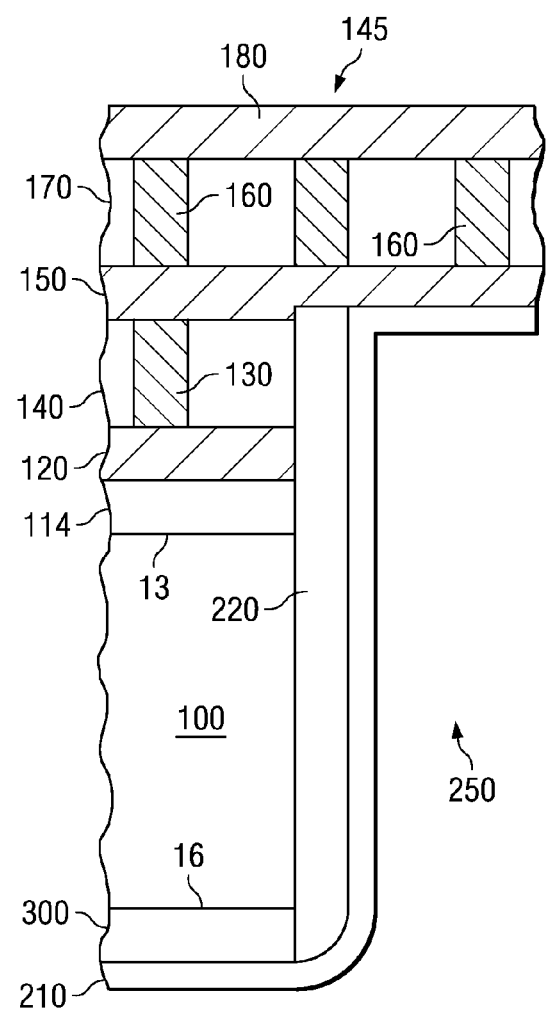

As illustrated in FIG. 6i, a trench metal liner 210 is deposited prior to filling the through trench 250 with the fill material 200. The trench metal liner 210 is ideally conformal or at least continuous, and may comprise a single layer or layer combination of Ta, TaN, W, WN, WCN, WSi, Ti, TiN, Ru as examples. The trench metal liner 210 is typically used as a barrier layer for preventing metal from diffusing into the underlying substrate 100 and sidewall dielectric layer 220. The trench metal liner 210 are deposited, for example, using for example, RF magnetron sputtering (PVD) or a CVD or ALD process. The trench metal liner 210 may comprise a seed layer of copper over the diffusion barrier layer. This seed layer may be deposited conformally or at least continuously using for example, a metal-organic CVD (MOCVD) process or a PVD process.

Figure 6J:
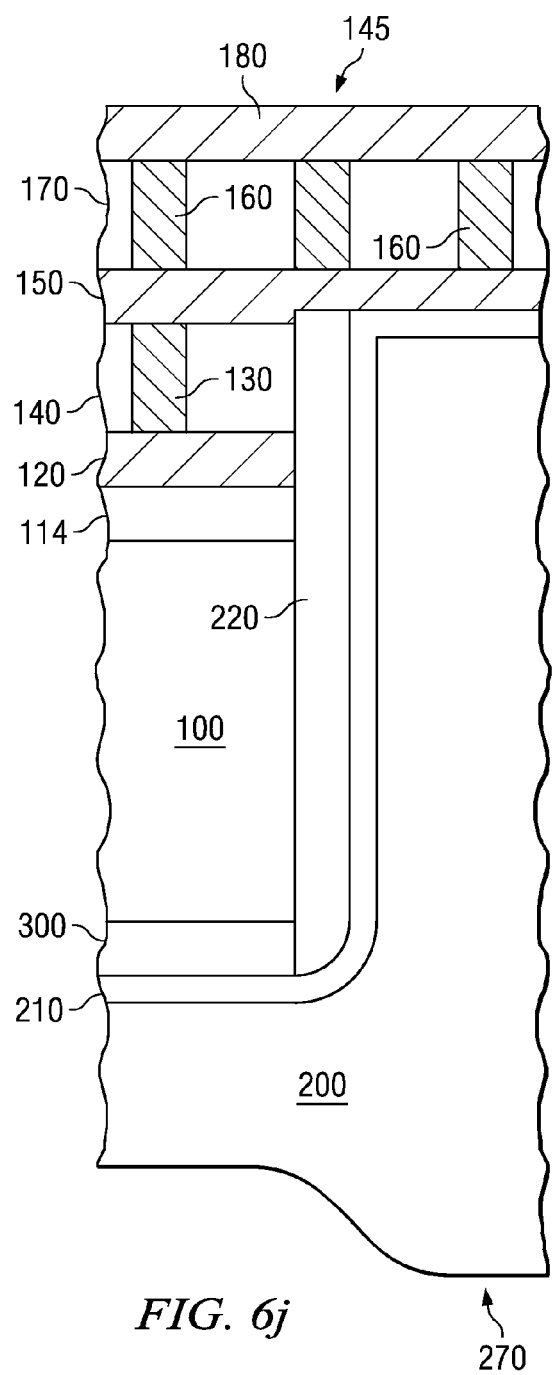

As illustrated in FIG. 6j, a fill material 200 is then deposited using, for example, an electroplating process. Excess portions of the fill material 200 are removed e.g., using a chemical-mechanical polishing (CMP) process forming TSV 270. In a different embodiment, the fill material 200 comprises tungsten. If the fill material 200 comprises tungsten, preferably a bi-layer seed layer comprising CVD titanium nitride and silicon doped tungsten are used. Similarly, in some embodiments, doped poly-silicon may be deposited inside the through trench 250 to form the TSV 270.

A significant difference in coefficient of thermal expansion can create significant stress concentration around the TSV 270 due to subsequent thermal processing. Such increased stress can result in significant yield loss arising from cracks, de-lamination, via collapse, etc. One way to reduce stress around the TSV 270 includes filling the TSV 270 with a material with minimal thermal expansion. For example, metals typically expand faster than silicon, whereas dielectric materials expand slower than silicon. Hence, a composite fill material with an appropriate combination of a metal and dielectric material may be used to match the coefficient of thermal expansion of the substrate 100. The composite fill material may comprise a stack such as a single metal and single dielectric layer, a sequential stack of metal and dielectric layer, or other suitable mixtures. In an embodiment, the composite fill material is formed by a deposition of the fill material 200 followed by a deposition of a dielectric material. In such an embodiment, the core of the TSV 200 comprises a non-conducting material, whereas the outer shell comprising the fill material 200 forms the electrical conductor.

As manufacturability is a key concern, in various embodiments, after selecting suitable materials, the thickness of the fill material 200 may be optimized relative to a thickness of the dielectric material. For example, the fraction of the fill material 200 ($f_{FM}$) may be identified based on the materials selected. For example, this ratio is a ratio of thickness of the fill material 200 to the half width of the trench, if the composite fill material comprises two layers as discussed above. For a multilayered composite, a volumetric fraction would be a more appropriate means for selecting the composition of the composite fill material. The fraction ($f_{FM}$) depends on the relative difference between the coefficient of thermal expansions of silicon ($\alpha_{Si}$), fill material 200 ($\alpha_{FM}$) and the dielectric material ($\alpha_{DM}$) as $f_{FM}=(\alpha_{Si}-\alpha_{FM})/(\alpha_{FM}-\alpha_{DM})$. Hence, if oxide and copper are selected, a suitable fraction (thickness of copper and oxide layers) may be calculated to minimize stress concentrations (or other suitable metrics, such as Von Misses criterion, based on the stress tensor) in the trench corners.

In various embodiments, the microstructure or nanostructure of the composite may comprise layers of metal and dielectric layers, dielectric layers in a metal matrix, or metal layers in a matrix of dielectric material. In such embodiments, the composition of the composite material is tailored so that an effective coefficient of thermal expansion of the composite material is about the same as the coefficient of thermal expansion of the substrate (silicon) to minimize stress concentrations.

In some embodiments, a more sophisticated analysis utilizing 2D or 3D simulations using finite element simulators such as ANSYS™ or SPROCESS™ determines the appropriate material thickness or composition.

In some embodiments, the fill material 200 only partially fills the TSV 270. In such embodiments, the fill material 200 lines the sidewalls of the TSV 270, thus forming an unfilled inner core region. This inner core region may remain unfilled even after subsequent processing, and hence may remain filled with air. In some embodiments, an additional insulating material may fill this inner core region.

Figure 6K:
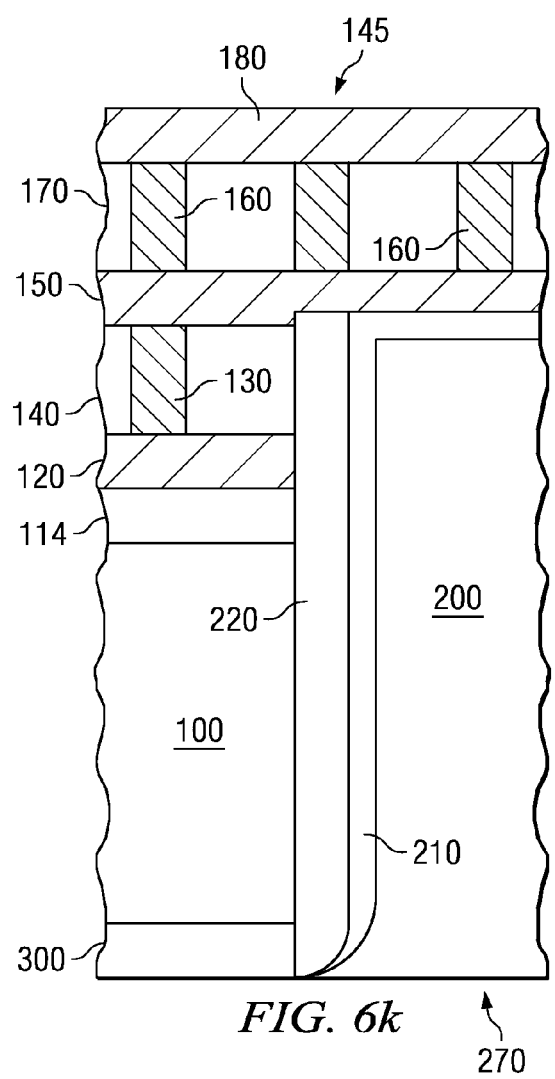
Figure 6L:
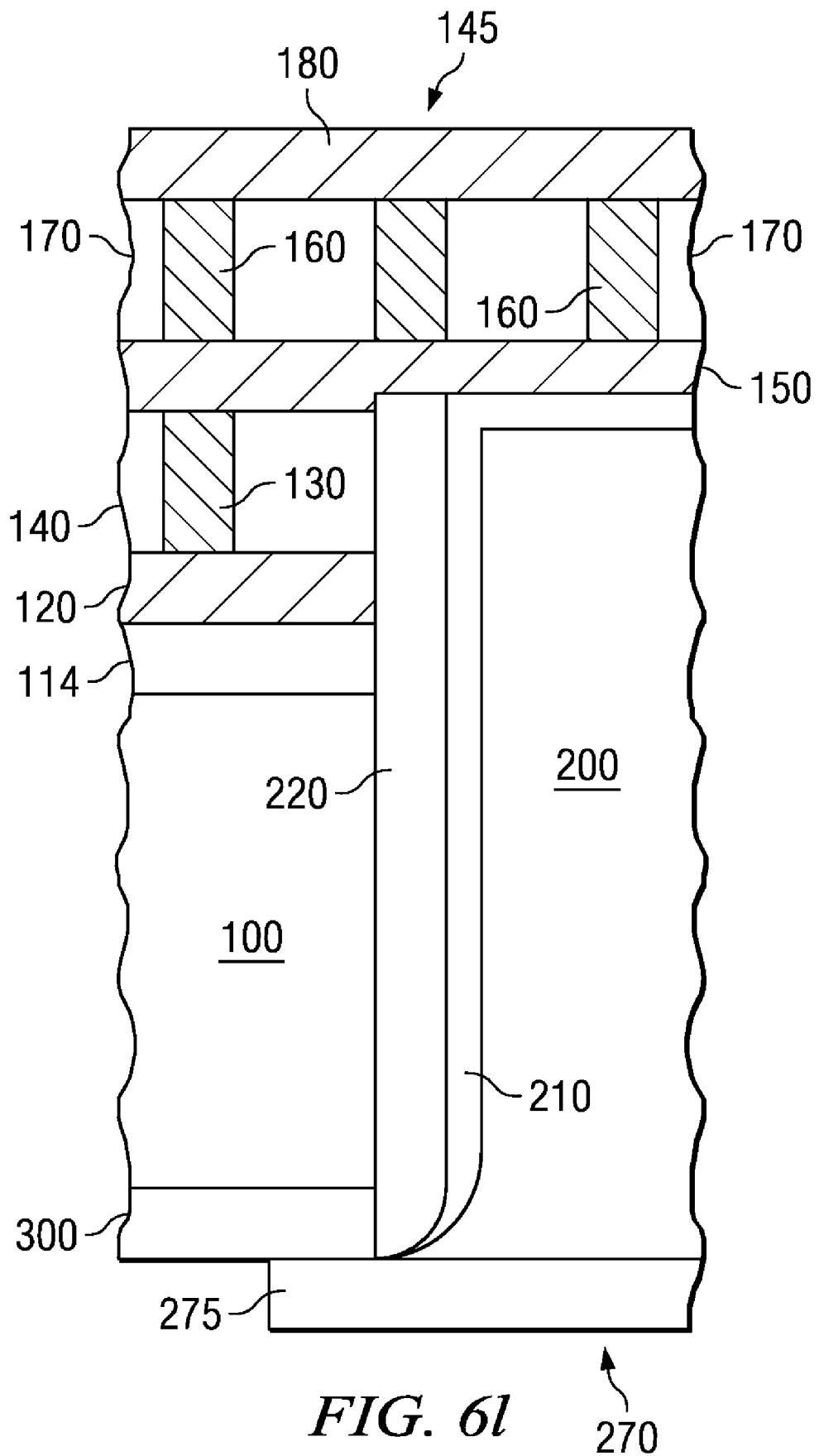

After the deposition of the fill material 200, the TSV 270 may be planarized from the back side. Depending on the electrical connection of the TSV 270 the remaining hard mask layer 300 may stay in place or can optionally be etched and removed, as shown in FIG. 6k. In some embodiments, as illustrated in FIG. 6l, a contact such as an aluminum bond pad may be attached to the outer surface of the TSV 270. Alternately, the contact may be formed by forming a solder ball on the top surface of the TSV 270.

Although not shown, the completed TSV chip may be either bonded directly to another TSV chip or bonded to another TSV chip through an intermediate interposer. The bonding may be performed directly by providing a suitable pressure and temperature or alternately using a suitable adhesive. Further, in various embodiments, the chips may be stacked by stacking wafers (wafer to wafer stacking), stacking individual chips obtained after dicing the wafers (chip to chip stacking), or stacking individual chips on a wafer (chip to wafer stacking).

A method of fabricating the landing pads in forming the through substrate via chip will now be described with respect to FIG. 8 and the flow chart of FIG. 7, in accordance to a different embodiment of the invention.

Figure 7:
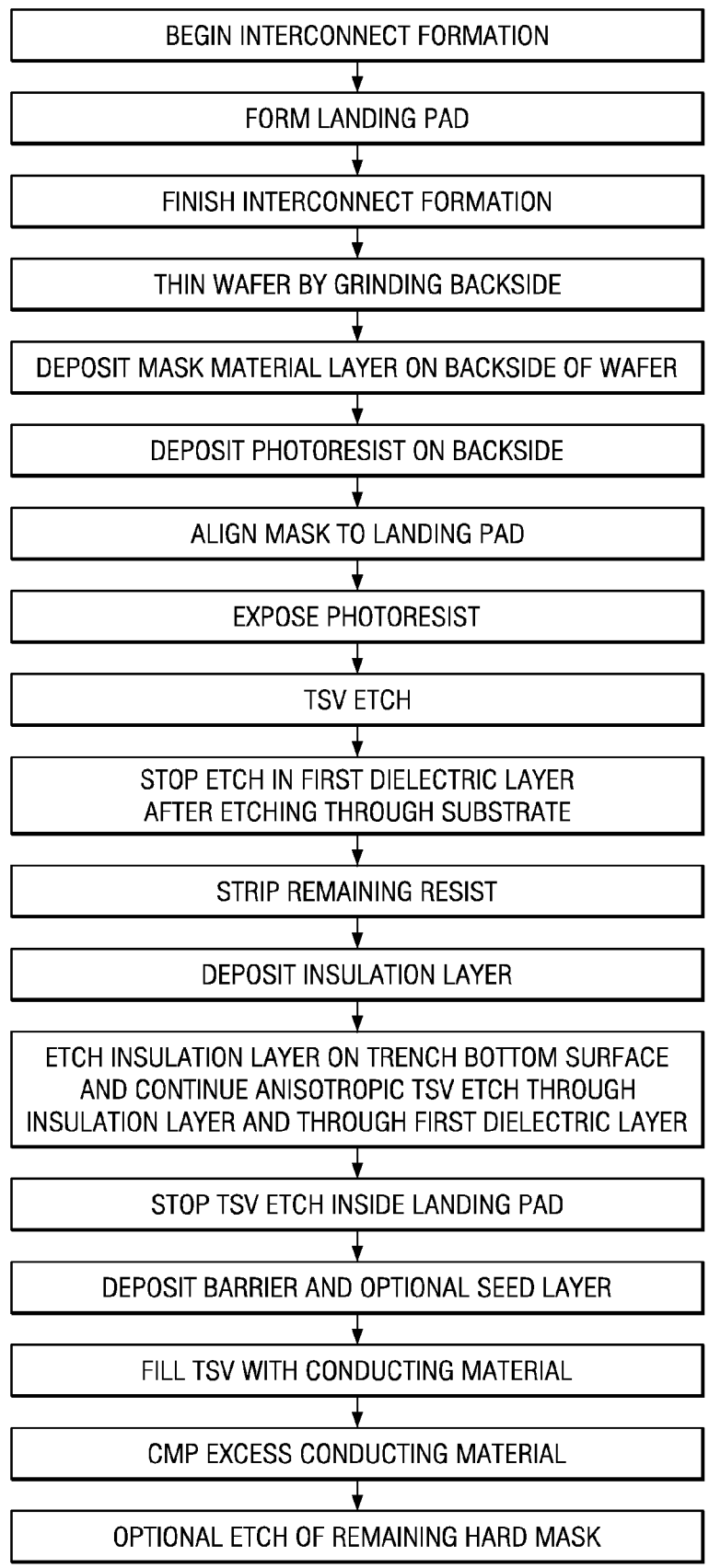
FIG. 7 is a flow chart of a method of forming the through substrate via chip according to an embodiment of the invention.

As illustrated in FIG. 7, the method in this embodiment follows the description and illustrations in FIGS. 6a-6e. In this embodiment, additional process steps are introduced to avoid formation of insulating sidewall layer covering the exposed side walls of the landing pad.

After the formation of the landing pad 145 illustrated in FIG. 6e, the substrate 100 is flipped and thinned (e.g., grinded) to expose a lower surface 16. A hard mask layer 300 is deposited on the lower surface 16 and patterned using a patterned photo resist layer 310 as a mask.

Figure 8A:
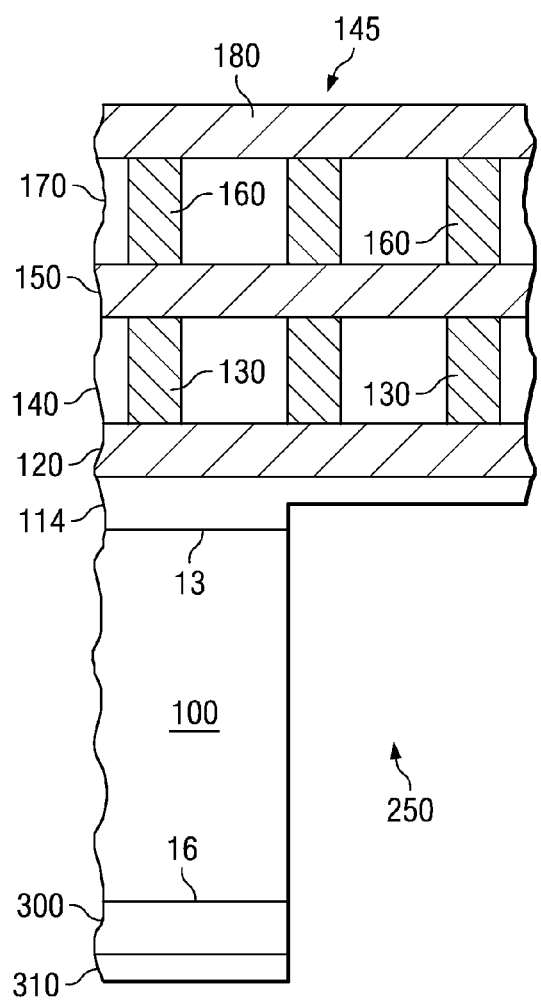
FIGS. 8a-8f, illustrates a method of manufacturing a through substrate via chip according to the embodiment illustrated in FIG. 7.
Figure 8B:
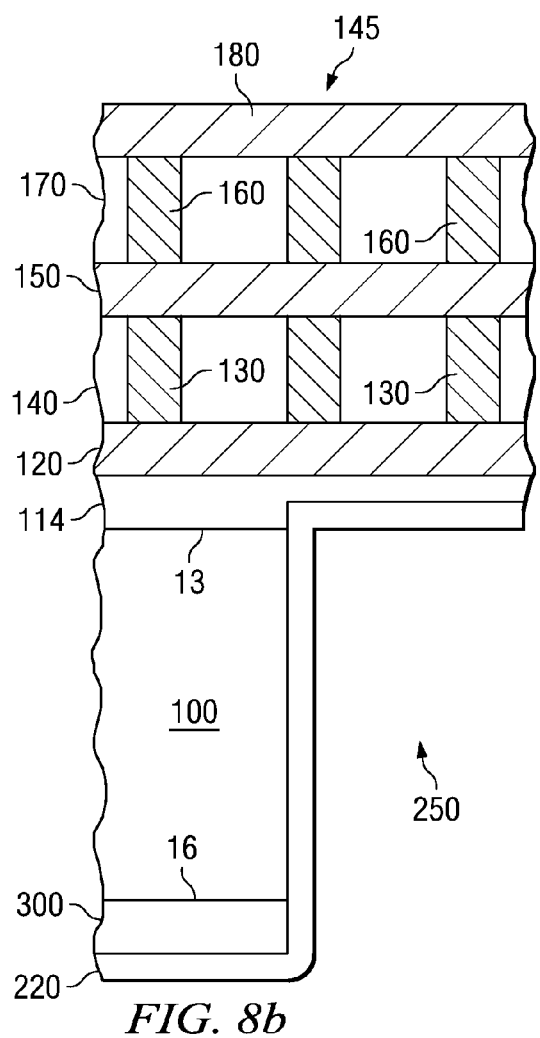
Figure 8C:
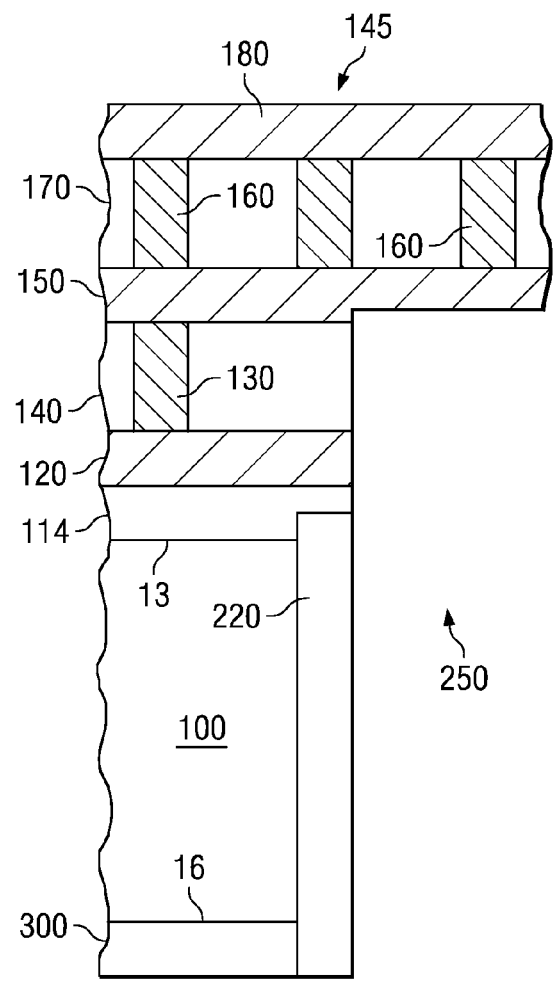
Figure 8D:
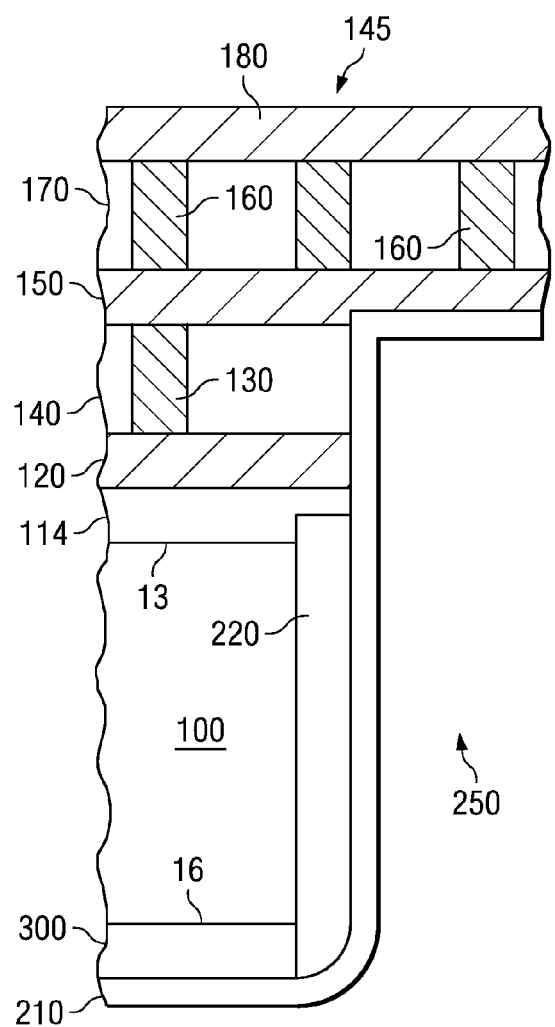
Figure 8E:
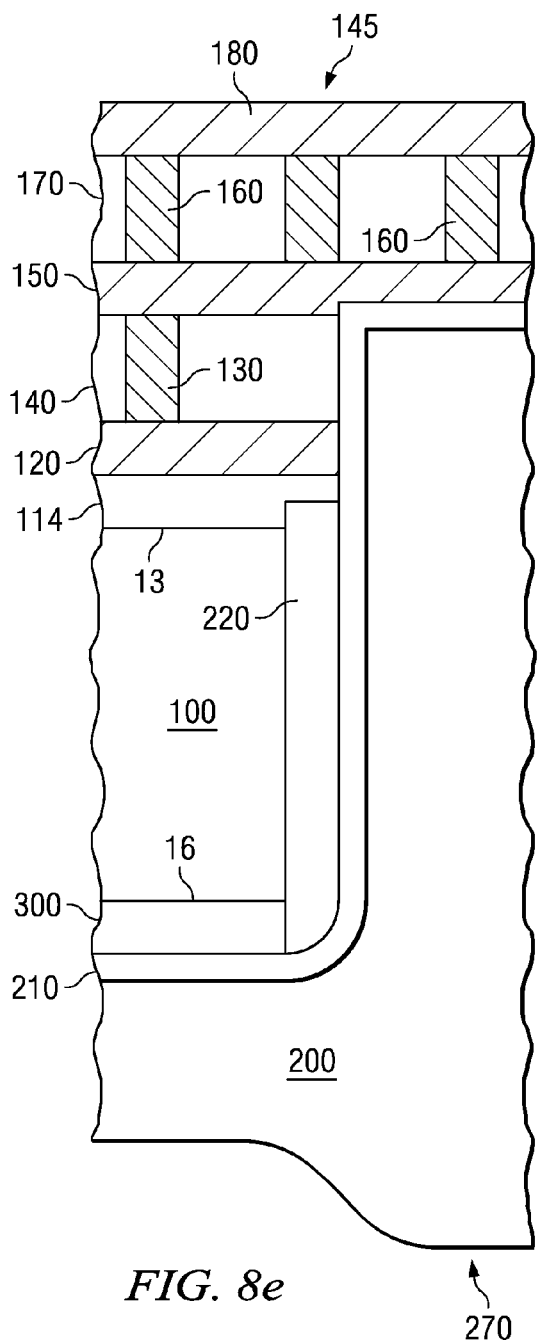
Figure 8F:
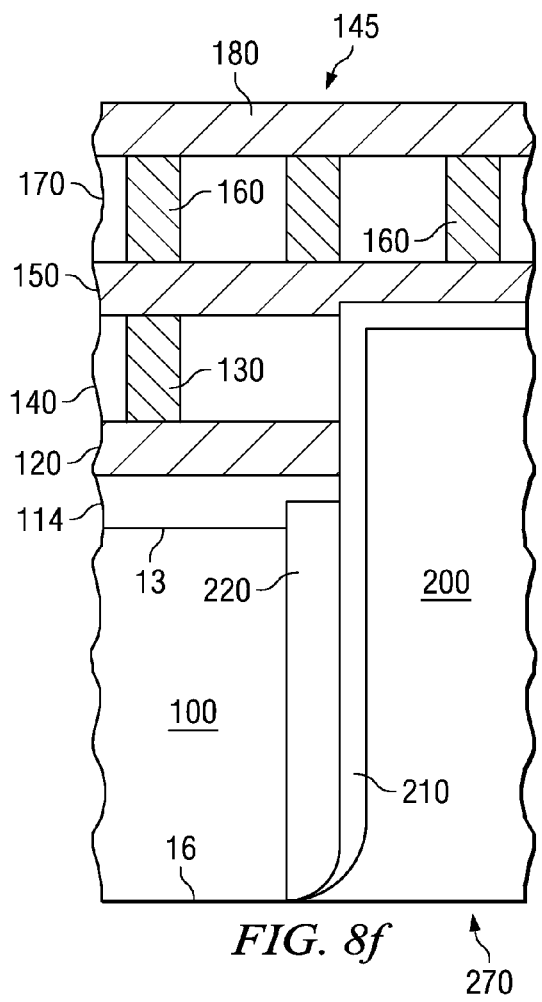

In this embodiment, as illustrated in FIG. 8a, the through trench etch is stopped after crossing into the first insulating material layer 114 forming a through trench 250. After the resist strip, the through trench 250 is lined with a sidewall dielectric layer 220 to electrically insulate the active regions from the TSV 270 as illustrated in FIG. 8b. Next, a subsequent anisotropic trench etch step forms a sidewall spacer of the dielectric layer 220 and etches the trench further through the dielectric 110, exposing at least a portion of the landing pad 145. In this embodiment, as illustrated in FIG. 8c, the first conductive plate 120, first vias 130 are etched through, whereas second conductive plate 150 is partially etched. In various embodiments, the etch may be stopped in other layers of the landing pad 145. As illustrated in FIG. 8d, a trench metal liner 210 is deposited conformally over the sidewall dielectric layer 220 and the exposed surface of the partially etched second conductive plate 150. The fill material 200 is filled into the through trench 250, as shown in FIG. 8e. The back side of the substrate 100 is planarized using for example, a CMP process. Excess layers such as metal and liner are removed and the remaining hard mask layer 300 may stay in place or can optionally be removed as well, thus forming TSV 270, as shown in FIG. 8f.

In an alternative embodiment, after deposition of the trench metal liner 210 (combined liner and Cu seed layer), a photo lithography step may be applied to define open areas over the TSV openings and over intended metal lines or redistribution layers, followed by a so called pattern plating step, where metal (Cu) is electroplated on top of the exposed (Cu) seed layer in between the resist pattern (i.e., in the TSV and the redistribution layer). After electroplating, the resist is stripped and the previously covered trench metal liner 210 (Cu seed layer and liner) in between the plated metal lines is etched by a dry or wet etch process. In this embodiment, a Cu-fill of the TSVs as well as Cu redistribution lines on the wafer backside is formed in a cost effective process sequence.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a first semiconductor component, the method comprising:
   forming landing pads on a top side of a substrate, the landing pads comprising multiple levels of conductive plates connected by conductive vias;
   forming trenches in the substrate, wherein an etch for forming trenches starts from a lower surface of the substrate and etches through the substrate and all material layers between the substrate and the landing pads; and
   forming through-vias in the substrate by lining the trenches with an insulator and filling the lined trenches with a conducting material.

2. The method of claim 1, wherein the etch for forming trenches removes a portion of the landing pads.

3. The method of claim 1, further comprising:
   before forming landing pads, forming active regions disposed on the top side of the substrate;
   thinning the substrate from a bottom side to expose the lower surface;
   aligning a lithographic mask on the lower surface, wherein the lithographic mask is aligned to the landing pads; and forming a pattern on the lower surface using the aligned lithographic mask.

4. The method of claim 1, wherein forming landing pads on the top side of the substrate comprises:
depositing a first insulating layer over a top surface of the substrate;
forming a first conductive plate over the first insulating layer;
depositing a second insulating layer on top of the first conductive plate;
patterning the second insulating layer;
forming first vias embedded in the second insulating layer; and
forming a second conductive plate over the second insulating layer, wherein the multiple levels of conductive plates comprise first and second conductive plates, and wherein the conductive vias comprise the first vias.

5. The method of claim 4, wherein forming landing pads on the top side of the substrate further comprises:
depositing a third insulating layer on top of the second conductive plate;
patterning the third insulating layer;
forming second vias embedded in the third insulating layer; and
forming a third conductive plate over the third insulating layer, wherein the multiple levels of conductive plates comprise the third conductive plates, and wherein the conductive vias comprise the second vias.

6. The method of claim 4, further comprising:
forming dummy insulating regions embedded in the multiple levels of conductive plates, wherein the dummy insulating regions vertically extend from a top level of the multiple levels of conductive plates to the first conductive plate, and wherein the dummy insulating regions comprise a material selected from the group comprising oxide, nitride, low k, or ultra low k dielectric material.

7. The method of claim 1, further comprising:
forming a second semiconductor component comprising a plurality of contacts;
aligning the through-vias on a bottom side of the first semiconductor components with the plurality of contacts on the second semiconductor component; and
electrically coupling the first and second semiconductor components by bonding the through-vias on the bottom side of the first semiconductor component with the plurality of contacts on the second semiconductor component.

8. The method of claim 1, wherein the insulator comprises a material selected from the group comprising oxide, nitride, oxynitride, FSG, FTEOS, parylene, BCB, SiLK, low k, or ultra low k material, and wherein the conducting material comprises a material selected from the group comprising polysilicon, tungsten, copper, or aluminum.

9. A method for forming a through substrate via, the method comprising:
forming a landing pad over a top surface of a substrate, the landing pad separated from the substrate by an insulating material layer, wherein the landing pad comprises multiple levels of conductive plates connected by conductive vias;
aligning a lithographic mask on a bottom surface of the substrate, wherein the lithographic mask is aligned with respect to at least one landing pad;
forming a pattern on the bottom surface using the aligned lithographic mask;
forming a trench in the substrate, wherein an etch for forming the trench starts from the bottom surface and etches through the substrate and stops inside the insulating material layer;
depositing a dielectric layer on exposed surfaces of the trench;
etching the trench further into the insulating material layer and stopping on the landing pad;
conformally lining the trench with a conducting diffusion barrier material; and
filling the lined trench with a conducting material.

10. The method of claim 9, wherein the etching removes at least a portion of the landing pad, and wherein the etching forms a dielectric spacer on a portion of sidewalls of the trench.

11. A through substrate via semiconductor device comprising:
a substrate comprising an upper surface and an opposite lower surface, wherein active devices are disposed in the upper surface;
a landing pad disposed above the upper surface of the substrate, wherein the landing pad comprises multiple levels of conductive plates connected by conductive vias; and
a through-via with a bottom surface disposed in the substrate and extending from the lower surface through the upper surface of the substrate and into the landing pad.

12. The through substrate via semiconductor device of claim 11, wherein the through-via establishes an electrical connection with the landing pad independent of a location of the bottom surface in the landing pad.

13. The through substrate via semiconductor device of claim 11, wherein the through-via comprises:
a dielectric layer lining sidewalls of a through substrate trench;
a conductive liner over a first insulating layer and on exposed surfaces of the through substrate trench; and
a conductive material filling the through substrate trench.

14. The through substrate via semiconductor device of claim 13, wherein the dielectric layer extends from the lower surface through the upper surface but not into the landing pads.

15. The through substrate via semiconductor device of claim 13, wherein the conductive material partially fills the through substrate trench, wherein an inner core of the through substrate trench is unfilled by the conductive material.

16. The through substrate via semiconductor device of claim 15, wherein an insulating material fills the inner core of the through substrate trench.

17. The through substrate via semiconductor device of claim 14, wherein the multiple levels of conductive plates connected by conductive vias comprise:
a first conductive plate disposed above the upper surface:
a second conductive plate disposed above the first conductive plate;
a first insulating layer disposed between the first and second conductive plates; and
first vias connecting the first conductive plate with the second conductive plate.

18. The through substrate via semiconductor device of claim 17, wherein the multiple levels of conductive plates connected by conductive vias further comprise:
a third conductive plate disposed above the second conductive plate;
a second insulating layer disposed between the second and third conductive plates; and second vias connecting the second conductive plate with the third conductive plate.

19. The through substrate via semiconductor device of claim 11, wherein the through-via comprises a composite fill material, wherein the composite fill material comprises a metal and a dielectric layer.

20. The through substrate via semiconductor device of claim 19, wherein a coefficient of thermal expansion of the composite fill material is about the same as that of a coefficient of thermal expansion of the substrate.

21. A through substrate via semiconductor device comprising:
   a semiconductor chip comprising a substrate, the substrate comprising an upper surface and an opposite lower surface, wherein active devices are disposed in the upper surface;
   landing pads disposed on a top side of the semiconductor chip, wherein the landing pads comprise:
      multiple levels of conductive plates disposed above the upper surface; and
      at least one via level connecting the multiple levels of conductive plates; and
   at least one through-via with a bottom surface, the at least one through-via extending from the lower surface through the upper surface into the landing pads, wherein the at least one through-via establishes an electrical connection with the landing pads independent of a location of a bottom surface in the landing pads, and wherein the at least one through-via is lined with a dielectric layer that extends from the lower surface to the upper surface but not into an etched portion of the landing pads.

22. The through substrate via semiconductor device of claim 21, wherein the multiple levels of conductive plates comprise islands of dielectric material extending from an upper level of the multiple levels of conductive plates to a lower level of the multiple levels of conductive plates.

23. The through substrate via semiconductor device of claim 22, wherein the islands of dielectric material comprise an oxide, wherein at least one level of the multiple levels of conductive plates is embedded in a low-k material layer.

24. A semiconductor component comprising:
   a first region comprising a first landing pad structure disposed above a substrate;
   a first through substrate via disposed inside the substrate, the first through substrate via contacting the first landing pad structure at a first distance above the substrate;
   a second region comprising a second landing pad structure disposed above the substrate; and
   a second through substrate via disposed inside the substrate, the second through substrate via contacting the second landing pad structure at a second distance above the substrate, wherein the ratio of the first distance to the second distance is greater than about 1.1.

25. The semiconductor component of claim 24, wherein the ratio of the first distance to a maximum allowed distance is about 0.6 to about 0.9, and wherein the ratio of the second distance to a maximum allowed distance is about 0.25 to about 0.55.

* * * * *